United States Patent [19]

Winter et al.

[11] Patent Number: 5,112,650
[45] Date of Patent: May 12, 1992

[54] CHEMICAL VAPOR DEPOSITION OF METAL CHALCOGENIDE FILMS

[75] Inventors: Charles H. Winter, Grosse Pointe Park; T. Suren Lewkebandara, Detroit, both of Mich.

[73] Assignee: Wayne State University, Detroit, Mich.

[21] Appl. No.: 683,273

[22] Filed: Apr. 10, 1991

[51] Int. Cl.$^5$ ............................................. C23C 16/00
[52] U.S. Cl. .................................................. 427/255.2
[58] Field of Search ..................................... 427/255.2

[56] References Cited

PUBLICATIONS

"Chemical Vapor Deposition of Titanium Disulfide", Bull. Chem. Soc. Jpn., 1978, 51, 3240.
"Kinetic Study on Chemical Vapor Deposition of Titanium Disulfide Thin Film", J. Electrochem. Soc., 1989, 136, 1265.
"Plasma Assisted CVD of TiS$_2$", Appl. Phys. A, 1989, 49, 105.

Primary Examiner—Bernard Pianalto
Attorney, Agent, or Firm—Brooks & Kushman

[57] ABSTRACT

A process for depositing a dense, thin film of a metal chalcogenide under high deposition rates is disclosed. The process comprises providing a source of vaporous metal halide so that it is delivered into a reaction zone provided with an inlet for the introduction thereof. A source of vaporous chalcogen is provided in communication with the inlet to promote an efficient intermixing of the chalcogen with the vaporous metal halide. Located downstream from the inlet in a reaction zone is a surface upon which deposition may occur. The reaction zone is heated to about 200–800 degrees Centigrade, and the reaction zone is then flushed with the chalcogen transported by an inert carrier gas. The carrier gas is passed with the metal halide and the chalcogen into the reaction zone across said substrate at atmospheric pressure. Thereupon, the vaporous metal halide and the vaporous chalcogen interact in the reaction zone to produce a film of metal chalcogenide which is deposited on the substrate.

16 Claims, 1 Drawing Sheet

CHEMICAL VAPOR DEPOSITION OF METAL CHALCOGENIDE FILMS

TECHNICAL FIELD

The present invention relates to the deposition of metal chalcogenide films onto a substrate through the use of chemical vapor deposition techniques.

BACKGROUND ART

In recent years, thin films of certain species of metal chalcogenides, such as titanium sulfide ($TiS_2$) and other transition metal sulfide materials have been studied. Films of $TiS_2$ may be formed using chemical vapor deposition (CVD) methods, by sulfurization of titanium metal at elevated temperatures, and by sputtering methods.

In order to prepare $TiS_2$ thin films by plasma chemical vapor deposition methods (PCVD), a titanium source, such as titanium tetrachloride ($TiCl_4$) or Ti metal, is reacted with hydrogen sulfide ($H_2S$) in a plasma between 300° and 450° C. This results in either powder formation or deposition of a thin film, depending on the conditions. As exemplified by Kikkawa et al (*Appl. Phys.* A 1989, 49, 105) gaseous $TiCl_4$ and $H_2S$ were reacted for 10–60 minutes in a low pressure glow discharge at temperatures below 450° C. to yield a thin film of $TiS_2$. However, such techniques require that relatively cumbersome, expensive apparatus be used to generate the exacting low pressure experimental conditions.

In order to fabricate $TiS_2$ films by low pressure chemical vapor deposition (LPCVD), gaseous $TiCl_4$ is reacted with $H_2S$ in a nitrogen or argon stream at low pressures ($\leq 30$ torr). Representative of LPCVD techniques is Kanehori et al (*J. Electrochem. Soc.* 1989, 136, 1265), in which $TiCl_4$ and $H_2S$ were reacted in the gas phase at 510° C. to produce stoichiometric films of $TiS_2$. However, a major drawback of such techniques is that the deposition rates are quite slow. For example, deposition rates may vary between 3 and 9 microns per hour, depending upon the carrier gas flow rate.

A study of the formation of $TiS_2$ films by atmospheric pressure chemical vapor deposition (APCVD) was reported by Motojima et al (*Bull. Chem. Soc. Jpn.* 1978, 51, 3240), in which a gaseous mixture of $TiCl_4$ and $H_2S$ in argon yielded $TiS_2$ thin films at temperatures between 400° and 850° C. However, the crystallinity, stoichiometry and resultant film density varied markedly with temperature and flow rate. As a result, this technique makes it difficult to reproduce thin films of given characteristics with any reliability.

In such prior art methods, various problems are encountered. Relatively complex equipment and instrumentation are required to prepare the films. Additionally, use of a toxic and extremely odiferous gas, such as $H_2S$, is necessary. Also, the $TiS_2$ film stoichiometry can vary significantly from the desired titanium to sulfur ratio of 1:2. Further, the film deposition rates of the prior art methods tend to be quite slow, especially where thin films of high quality are desired. Moreover, the density of the resultant $TiS_2$ films is likely to be less than that of bulk $TiS_2$. This may consequently lead to inferior electrical, optical and diffusion properties.

Accordingly, it would be desirable to develop a method for the production of thin films of metal chalcogenides that uses straightforward, low cost instrumentation and equipment, has high film deposition rates, utilizes less toxic and less volatile chalcogen sources, produces stoichiometric films, and affords highly dense films that exhibit superior electrical, optical, and diffusion properties.

DISCLOSURE OF THE INVENTION

It is therefore an object of the invention to provide a chemical vapor deposition method for depositing thin films of metal chalcogenides in which the use of atmospheric pressure greatly simplifies the equipment and instrumentation required to prepare the films.

Also, an object of the invention is to provide a process that produces films at high deposition rates.

Additionally, it is an object of the invention to employ a less toxic and less volatile source of chalcogens.

Further, it is an object of the invention to produce stoichiometric films of highly dense metal chalcogenide films, thereby maximizing electrical, optical and diffusion properties.

In satisfying the above-mentioned objects of the invention, a source of chalcogens is provided under atmospheric pressure. The source comprises, for example, thiol vapor transported by an inert gas and a metal source such as $TiCl_4$. Each of these reactants is provided in its gas phase and is delivered preferably from an injector having concentric chambers which may, for example, be annular in cross-section.

The reagents are delivered through the injector at atmospheric pressure to a heated substrate which is supported within a reaction chamber. Effluents are exhausted through a liquid trap which performs an absorbing function.

Accordingly, the present invention discloses a chemical vapor deposition technique to react metal halides with hydrogen or carbon-substituted sulfur sources $R_2S_n$ (n=1,2) to produce metal chalcogenide thin films of enhanced quality, efficiently using economic equipment and instrumentation.

BEST MODE FOR CARRYING OUT THE INVENTION

A metal chalcogenide film to be formed on a substrate may be crystalline or amorphous. However, a crystalline film is preferable to an amorphous film since the optical, electronic, and diffusion properties are more uniform. Also, many technological applications require crystalline materials for optimum performance. Accordingly, the invention disclosed herein is directed to the process for preparing thin metal chalcogenide films formed on a substrate, such films being crystalline in nature.

Figure 1:
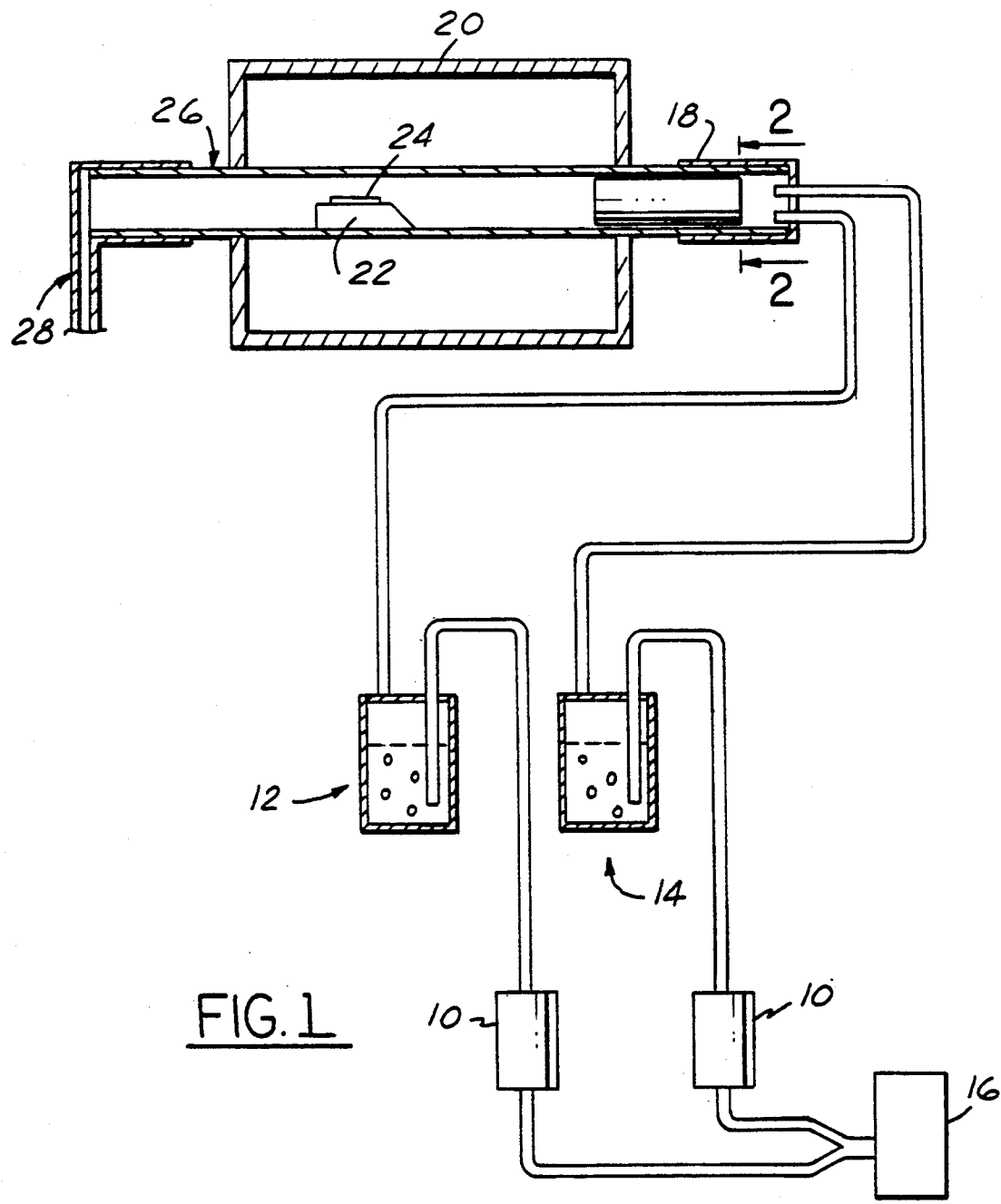
FIG. 1 is a schematic view of apparatus used to practice the disclosed method for producing substrates coated with a thin film of metal chalcogenide according to the present invention.

Referring to FIG. 1, an illustrative apparatus is shown in accordance with the practice of present invention. The apparatus comprises flow controllers 10 for delivery of a carrier fluid, such as inert nitrogen or argon. To produce a saturated vapor of the reactants, bubblers 12 and 14 are provided for delivery thereof.

Suitable reactants include, for example, $TiCl_4$ as a source of titanium metal as a component of the thin film to be produced. To provide the necessary chalcogen, for example, a sulfur source $R_2S_n$ is also provided.

To mix the gaseous reaction components in their vapor phase, an injector 18 is provided in fluid communication with the bubblers 12, 14. While various alternative structures of injector 18 are possible, good results have been obtained where the injector 18 comprises a concentric assembly (see FIG. 2) of delivery tubes in fluid communication with the bubblers 12, 14.

In the preferred embodiment, the concentric assembly of tubes 18 has flow channels 30, 32, and 34 which are annular in cross-section.

Figure 2:
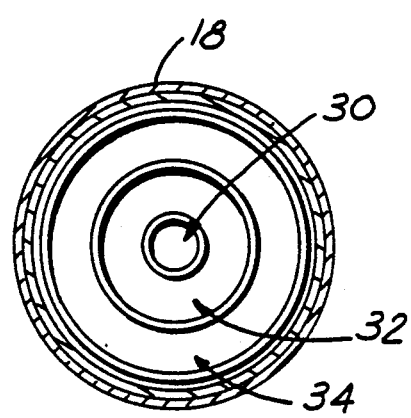
FIG. 2 is a sectional view of an injector taken along the line 2—2 of FIG. 1.

As illustrated in FIG. 2, for example, the injector 18 may deliver a vapor containing a metal halide (e.g. $TiCl_4$) through the central passage 30. Surrounding the passage 30 is an annular area 32 which is defined by a concentric tube so that an inert carrier gas (e.g. $N_2$ or Ar) may be delivered therethrough. Surrounding the area 32 is an outer tube which defines an annular chamber 34 within which a chalcogen source (e.g. RSH) is delivered, again in vapor form.

While representative embodiments of the injector device 18 in the injector assembly are described, it should be realized that other connections are possible, whereby the chalcogen source could, for instance, be delivered to the central tube 30. Alternatively, the metal halogen source could be delivered through either of the surrounding concentric tubes through passages 32, 34.

Additionally, it should be understood that other forms of injector assembly may also be well suited to serve the function of delivering the reagents in such a way as to produce an efficient intermixing thereof upstream of a substrate 24 in the reaction zone.

The reaction components are then delivered to a vessel defining the reaction zone 26, the vessel 26 being supported in a furnace 20 that can be adjusted to a desired temperature. Supported within the vessel 26 is the substrate 24, and a substrate support 22 to hold the substrate 24 in the path of the reactants.

An exhaust 28 is connected to an outlet end of the vessel 26.

After the reactants leave the exhaust 28, they become trapped in a bath (not shown) of aqueous hydroxide which serves to capture unreacted effluents.

EXAMPLE 1

In using the above apparatus, one technique involves providing a low sodium glass plate substrate 24 (e.g. $1 \times 13 \times 47$ mm) disposed on the substrate support 22, which was positioned ahead of the injector 18. The tube was then flushed with an inert carrier gas while the furnace 20 was heated to a desired temperature of about 200°–800° C. Upon reaching such temperature, a carrier gas containing tert-butyl thiol ($^tBuSH$) was introduced for a period ranging from about two seconds to five minutes.

After this sulfur pretreatment period, productive gas containing $TiCl_4$ was introduced for a period ranging from about 5 seconds to 15 minutes, depending on the desired thickness of the film.

The CVD reaction that occurred when the furnace was heated resulted in the substrate being coated at atmospheric pressure with titanium sulfide in the form of $TiS_2$.

In accordance with the experimental results, only 75 seconds were required to deposit a bronze-colored $TiS_2$ film having an average thickness of about 1.5 microns.

The $TiS_2$ product made in accordance with the present invention has been characterized by X-ray powder diffraction, VIS-IR transmission spectrophotometry, scanning electron microscopy, and by electrical conductivity measurements. Such analyses showed that the thin films are stoichiometric bronze-colored $Ti_{1.00 \pm 0.02}S_{2.00 \pm 0.02}$ with <2% carbon or chlorine contaminants. Film thicknesses ranged from about 0.5 to 3 microns, with an average crystallite grain diameter of about 100–500 angstroms. The films were very dense, as shown by scanning electron microscopy. Transmission spectra showed that the films were opaque in the spectral region of 400–900 nanometers, but became transparent above 900 nanometers. The material is a semiconductor.

For reference, a film formation process was performed in the same manner as described above but without the sulfur pretreatment. Exposure of a low sodium glass substrate to the $TiCl_4/R_2S_n$ vapor for 5 minutes resulted in the deposition of a film of titanium oxide.

EXAMPLE 2

Crystalline $TiS_2$ film was also deposited on quartz and stainless steel substrates. Using the apparatus and the experimental method described in Example 1 and using $^tBuSH$ as the sulfur source, high quality bronze-colored thin films of $TiS_2$ were deposited on both quartz and stainless steel substrates.

EXAMPLE 3

Experiments were conducted to determine the range of sulfur compounds that could be reacted with $TiCl_4$ to produce thin films of $TiS_2$. The apparatus and experimental method described in Example 1 were used in the herein described experiments.

The chemical vapor deposition reaction of methyl sulfide ($Me_2S$) with $TiCl_4$ produced a bronze-colored film of $TiS_2$ on a low sodium glass. A similar result was obtained using methyl disulfide (MeSSMe) as the sulfur source.

EXAMPLE 4

Experiments were also conducted to determine the range of metal halides that could be reacted with a range of sulfur compounds to produce thin films of metal sulfides in accordance with the present invention. Using the conditions and experimental method described in Example 1, the atmospheric pressure chemical vapor deposition reaction of $^tBuSH$ with vanadium tetrachloride ($VCl_4$) afforded a clear smoke gray film of vanadium sulfide ($V_2S_5$). Similarly, the reaction of stannic chloride with $^tBuSH$ afforded black films of stannous sulfide (SnS).

Against the background of the foregoing examples, it will now be appreciated that in carrying out the invention, $TiCl_4$ for instance, undergoes a series of reactions initiated in the gas phase with the sulfur source, which produces $TiS_2$ thin films.

As an illustration, $TiCl_4$ reacts with $H_2S$ to produce a thiolate species as follows:

$$TiCl_4 + nH_2S = [(HS)_n TiCl_{4-n}]_x + nHCl \qquad (1)$$

If this thiolate species is not volatile, the reaction product may precipitate from the gas phase to either form a thin film on the substrate or, undesirably, nucleate to form a powder, depending on the experimental conditions.

If the film forming process proceeds kinetically too quickly, a low density, low quality film generally results. If, however, H$_2$S is replaced by different volatile divalent sulfur sources, such as thiols (RSH), sulfides (RSR'), or disulfides (RSSR') especially where one or both of the substituents is carbon with sp, sp$^2$, or sp$^3$ hybridization, then the gas phase titanium species may be more volatile, have less tendency to aggregate, and may lead to higher quality film formation as follows:

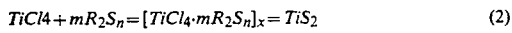

$$TiCl_4 + mR_2S_n = [TiCl_4 \cdot mR_2S_n]_x = TiS_2 \qquad (2)$$

Alternatively, gas phase pyrolysis of a sulfur compound may lead to the controlled formation of H$_2$S, which would then react with TiCl$_4$ to form the TiS$_2$ thin films as follows:

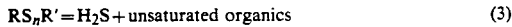

$$RS_nR' = H_2S + \text{unsaturated organics} \qquad (3)$$

Any of these alternative reaction mechanisms will produce thin films with enhanced properties in comparison with those prepared by known prior art methods.

As is apparent from the foregoing descriptions, the process for depositing thin films of metal chalcogenide according to the present invention has various advantages, including:

(1) High-quality films of metal chalcogenide are produced at moderate temperatures;

(2) The films prepared according to the present invention are quite dense, which imbues superior electrical, optical, and diffusion properties to the thin films produced thereby;

(3) Film deposition rates are typically about 1.0–1.5 microns per minute, which is faster than was previously attainable;

(4) The equipment and instrumentation required for the process is readily available, easy to manipulate, and is low cost;

(5) Less toxic and volatile chalcogen sources are used; and (6) The process lends itself to the use of other volatile metal halides, including vanadium tetrachloride and stannic chloride.

While other applications of the metal chalcogenide films formed by the disclosed process are possible, the more promising applications include cathode materials for lithium batteries, bronze-colored coatings, infrared transparent coatings and lubricating coatings for various materials.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A process for depositing a thin film of a metal chalcogenide comprising the steps of:

providing a source of vaporous metal halide so that it is delivered into a reaction zone provided with an inlet for the introduction thereof;

providing a source of vaporous chalcogen in communication with the inlet to provide an efficient intermixing of the chalcogen with the vaporous metal halide;

disposing a substrate downstream from the inlet of said reaction zone to define a surface upon which deposition may occur;

heating the reaction zone to about 200–800 degrees Centigrade;

flushing the reaction zone with the chalcogen transported by an inert carrier gas;

passing said carrier gas with said metal halide and said chalcogen into said reaction zone across said substrate; and reacting said vaporous metal halide and said vaporous chalcogen in said reaction zone to produce a film of metal chalcogenide which is deposited on the substrate.

2. The process of claim 1 wherein the source of vaporous chalcogen is a thiol vapor.

3. The process of claim 1 wherein the source of vaporous chalcogen is vanadium tetrachloride.

4. The process of claim 1 wherein the source of vaporous chalcogen is stannic chloride.

5. The process of claim 1 wherein the step of reacting said vaporous metal halide and said vaporous chalcogen occurs under atmospheric pressure.

6. The process of claim 1 wherein the metal halide is titanium tetrachloride.

7. The process of claim 1 wherein the inlet comprises coaxial passages defining concentric chambers, each chamber being in communication with a reagent source.

8. The process of claim 1 wherein the source of vaporous chalcogen comprises a reactant selected from a group consisting of thiols (RSH), sulfides (RSR'), and disulfides (RSSR'), wherein the carbon bonded to sulfur may be of sp, sp$^2$, or sp$^3$ hybridization.

9. The process of claim 1 wherein the inert carrier gas includes tert-butyl thiol ($^t$BuSH).

10. The process of claim 1 wherein the step of flushing the reaction zone comprises flowing the chalcogen through the reaction zone for a period ranging from about two seconds to five minutes.

11. The process of claim 1 wherein the step of providing a source of vaporous metal halide comprises providing a source of titanium tetrachloride for a period ranging from about five seconds to fifteen minutes.

12. The process of claim 1 wherein the metal chalcogenide comprises titanium disulfide.

13. The process of claim 1 wherein the substrate comprises a low sodium glass plate.

14. The process of claim 1 wherein the substrate comprises a stainless steel.

15. The process of claim 1 wherein the substrate comprises quartz.

16. The process of claim 1 wherein the thin film of metal chalcogenide is deposited at a rate of about 60–90 microns per hour.

* * * * *